US009543385B2

(12) United States Patent
Cohen et al.

(10) Patent No.: US 9,543,385 B2
(45) Date of Patent: Jan. 10, 2017

(54) HEAVILY DOPED SEMICONDUCTOR NANOPARTICLES (75) Inventors: Guy Cohen, Tel Aviv (IL); Oded Millo, Jerusalem (IL); David Mocatta, Gadera (IL); Eran Rabani, Har Adar (IL); Uri Banin, Mevasseret Zion (IL)

(73) Assignees: YISSUM RESEARCH DEVELOPMENT COMPANY OF THE HEBREW UNIVERSITY OF JERUSALEM LTD., Jerusalem (IL); RAMOT AT TEL-AVIV UNIVERSITY LTD., Tel Aviv (IL)

( * ) Notice: Subject to any disclaimer, the term of this patent is extended or adjusted under 35 U.S.C. 154(b) by 100 days.

(21) Appl. No.: 13/980,348

(22) PCT Filed: Feb. 14, 2012

(86) PCT No.: PCT/IL2012/050046
§ 371 (c)(1),
(2), (4) Date: Jul. 18, 2013

(87) PCT Pub. No.: WO2012/111009
PCT Pub. Date: Aug. 23, 2012

(65) Prior Publication Data
US 2013/0299772 A1  Nov. 14, 2013

Related U.S. Application Data (60) Provisional application No. 61/442,522, filed on Feb. 14, 2011.

(51) Int. Cl.
*H01L 29/06*  (2006.01)
*H01L 21/02*  (2006.01)
(Continued)

(52) U.S. Cl.
CPC ........ *H01L 29/0665* (2013.01); *B01J 13/0039* (2013.01); *B82Y 10/00* (2013.01);
(Continued)

(58) Field of Classification Search
None
See application file for complete search history.

(56) References Cited

U.S. PATENT DOCUMENTS 6,788,453 B2    9/2004  Banin et al.
2003/0010987 A1  1/2003  Banin et al.
(Continued)

FOREIGN PATENT DOCUMENTS

GB    2470131 A    11/2010
WO    WO 02/25745 A2    3/2002
(Continued)

OTHER PUBLICATIONS

Written Opinion of the International Searching Authority for PCT/IL2012/050046, Pub. Date: Aug. 14, 2013.*
(Continued)

*Primary Examiner* — Andres Munoz
(74) *Attorney, Agent, or Firm* — Oliff PLC (57) ABSTRACT Herein, provided are heavily doped colloidal semiconductor nanocrystals and a process for introducing an impurity to semiconductor nanoparticles, providing control of band gap, Fermi energy and presence of charge carriers. The method is demonstrated using InAs colloidal nanocrystals, which are initially undoped, and are metal-doped (Cu, Ag, Au) by adding a metal salt solution.

21 Claims, 9 Drawing Sheets (51) Int. Cl.

| | |
|---|---|
| *B01J 13/00* | (2006.01) |
| *B82Y 10/00* | (2011.01) |
| *C09K 11/62* | (2006.01) |
| *H01L 29/167* | (2006.01) |
| *H01L 29/207* | (2006.01) |
| *H01L 29/227* | (2006.01) |
| *H01L 29/36* | (2006.01) |
| *C09K 11/54* | (2006.01) |
| *C09K 11/61* | (2006.01) |
| *C09K 11/64* | (2006.01) |
| *C09K 11/88* | (2006.01) |
| *H01L 21/22* | (2006.01) |
| *H01L 33/18* | (2010.01) |

(52) U.S. Cl.
CPC .............. *C09K 11/54* (2013.01); *C09K 11/61* (2013.01); *C09K 11/62* (2013.01); *C09K 11/64* (2013.01); *C09K 11/88* (2013.01); *C09K 11/881* (2013.01); *C09K 11/883* (2013.01); *H01L 21/02601* (2013.01); *H01L 21/22* (2013.01); *H01L 29/167* (2013.01); *H01L 29/207* (2013.01); *H01L 29/227* (2013.01); *H01L 29/365* (2013.01); *H01L 33/18* (2013.01)

(56) References Cited

U.S. PATENT DOCUMENTS

| | | | |
|---|---|---|---|
| 2005/0129947 A1* | 6/2005 | Peng et al. ............. | B82Y 15/00 428/403 |
| 2005/0167646 A1 | 8/2005 | Banin et al. | |
| 2005/0189534 A1* | 9/2005 | Guyot-Sionnest .. | H01L 31/0352 257/21 |
| 2007/0194279 A1* | 8/2007 | Peng ...................... | C09K 11/02 252/301.4 F |
| 2008/0128761 A1 | 6/2008 | Banin et al. | |
| 2008/0169753 A1* | 7/2008 | Skipor et al. .................. | 313/504 |
| 2009/0230382 A1 | 9/2009 | Banin et al. | |
| 2010/0044209 A1 | 2/2010 | Banin et al. | |
| 2010/0055462 A1* | 3/2010 | Cao ............................... | 428/403 |
| 2012/0261624 A1* | 10/2012 | Peng et al. ................. | 252/518.1 |

FOREIGN PATENT DOCUMENTS

| | | |
|---|---|---|
| WO | WO 02/43159 A2 | 5/2002 |
| WO | WO 03/097904 A1 | 11/2003 |
| WO | WO 2005/075339 A2 | 8/2005 |
| WO | WO 2006/134599 A1 | 12/2006 |
| WO | WO 2008/028054 A1 | 3/2008 |
| WO | WO 2008/102351 A2 | 8/2008 |
| WO | WO 2011/003003 A1 | 1/2011 |
| WO | WO 2011/033510 A2 | 3/2011 |

OTHER PUBLICATIONS

Jul. 30, 2012 International Search Report issued in PCT/IL2012/050046.

Norris et al. "Doped Nanocrystals," Science, Mar. 28, 2008, pp. 1776-1779, vol. 319.

Turnbull, D. "Formation of Crystal Nuclei in Liquid Metals," Journal of Applied Physics, Oct. 1950, pp. 1022-1028, vol. 21.

Dalpian et al. "Self-Purification in Semiconductor Nanocrystals," Physical Review Letters, Jun. 6, 2006, pp. 226802-1-226802-4, vol. 96.

Chan et al. "Size Limits on Doping Phosphorus into Silicon Nanocrystals," Nano Letters, Dec. 23, 2007, pp. 596-600, vol. 8 No. 2.

Shim et al. "n-type colloidal semiconductor nanocrystals," Nature, Oct. 26, 2000, pp. 981-983, vol. 407.

Wang et al. "Electrochromic Nanocrystal Quantum Dots," Science, Mar. 23, 2001, pp. 2390-2392, vol. 291.

Yu et al. "*n*-Type Conducting CdSe Nanocrystal Solids," Science, May 23, 2003, pp. 1277-1280, vol. 300.

Pradhan et al. "An Alternative of CdSe Nanocrystal Emitters: Pure and Tunable Impurity Emissions in ZnSe Nanocrystals," Journal of the American Chemical Society, Nov. 24, 2005, pp. 17586-17587, vol. 127 No. 50.

Bhargava et al. "Optical Properties of Manganese-Doped Nanocrystals of ZnS," Physical Review Letters, Jan. 17, 1994, pp. 416-419, vol. 72 No. 3.

Stowell et al. "Synthesis and Characterization of Dilute Magnetic Semiconductor Manganese-Doped Indium Arsenide Nanocrystals," Nano Letters, Sep. 11, 2003, pp. 1441-1447, vol. 3 No. 10.

Erwin et al. "Doping Semiconductor Nanocrystals" Nature, Jul. 7, 2005, pp. 91-94, vol. 436.

Yang et al. "Radial-Positioned-Controlled Doping in CdS/ZnS Core/Shell Nanocrystals" Sep. 6, 2006, pp. 12428-12429, vol. 128 No. 38.

Tuinenga et al. "In Situ Observation of Heterogeneous Growth of CdSe Quantum Dots: Effect of Indium Doping on the Growth Kinetics," ACS Nano, Jun. 20, 2008, pp. 1411-1421, vol. 2 No. 7.

Roy et al. "Progress toward Producing n-Type CdSe Quantum Dots: Tin and Indium Doped CdSe Quantum Dots" The Journal of Physical Chemistry C, Jul. 1, 2009, pp. 13008-130015, vol. 113 No. 30.

Xie et al. "Synthesis of Cu-Doped InP Nanocrystals (d-dots) with ZnSe Diffusion Barrier as Efficient and Color-Tunable NIR Emitters," Journal of American Chemical Society, Jul. 9, 2009, pp. 10645-10651, vol. 131 No. 30.

Mokari et al. "Diffusion of Gold into InAs Nanocrystals" Angewandte Chemie, 2006, pp. 8001-8005, vol. 45.

Mocatta et al. "Heavily Doped Semiconductor Nanocrystal Quantum Dots," Science, Apr. 1, 2011, pp. 77-81, vol. 332.

\* cited by examiner

HEAVILY DOPED SEMICONDUCTOR NANOPARTICLES

FIELD OF THE INVENTION

This invention relates to doped semiconductor nanoparticles.

BACKGROUND OF THE INVENTION

Doping of bulk semiconductors, the process of intentional introduction of impurity atoms into a crystal discovered back in the 1940s, is a key route for tuning their properties. Its introduction allowed the wide-spread application of semiconductors in electronic and electro-optic components [1]. Controlling the size and dimensionality of semiconductor structures is an additional powerful way to tune their properties via quantum confinement effects. In this respect, colloidal semiconductor nanocrystals have emerged as a family of materials with size dependent optical and electronic properties. Combined with their capability for wet-chemical processing, this has led to nanocrystal-based light emitting diodes, solar cells and transistor devices prepared via facile and scalable bottom-up approaches. Impurity doping in such colloidal nanocrystals still remains an open challenge [2]. From the synthesis side, the introduction of a few impurity atoms into a nanocrystal which contains only a few hundred atoms may lead to their expulsion to the surface [3-5] or compromise the crystal structure. This inherently creates a highly doped nanocrystal under strong quantum confinement, and the electronic and optical properties in such circumstances are still unresolved.

Several strategies have been employed so far for doping nanocrystals. Binding ligands on the nanoparticle surface, which can donate carriers, or electrochemical carrier injection, have been shown to yield n-type doping in semiconductor nanocrystal superlattices [6-8]. While of great interest, such remote doping differs from substitutional doping, which has been studied mainly for color center impurities [9] and magnetic impurities, notably Mn atoms [10,11], providing insight to the challenging chemistry [12]. It should be noted, that despite efforts to concentrate such doping solely in the nanocrystal, significant amounts of the dopant materials were found associated with the nanocrystals surface.

Introduction of dopant precursors at specific stages of nanoparticle growth were effective in controlling the impurity location [13]. More recently, some progress has been made towards producing n-type CdSe quantum-dots (QDs) using tin and indium impurities [14, 15], and p-type InP using Cu impurities [16].

REFERENCE

[1] S. M. Sze, Physics of Semiconductor Devices (Wiley-Interscience, New York ed. 2nd, 1981
[2] D. J. Norris, A. L. Efros, S. C. Erwin, Science 319, 1776 (2008).
[3] D. Turnbull, Journal of Applied Physics 21, 1022 (1950).
[4] G. M. Dalpian, J. R. Chelikowsky, Physical Review Letters 96, 226802 (2006).
[5] T. L. Chan, M. L. Tiago, E. Kaxiras, J. R. Chelikowsky, Nano Letters 8, 596 (2007).
[6] M. Shim, P. Guyot-Sionnest, Nature 407, 981 (2000).
[7] C. J. Wang, M. Shim, P. Guyot-Sionnest, Science 291, 2390 (2001).
[8] D. Yu, C. J. Wang, P. Guyot-Sionnest, Science 300, 1277 (2003).
[9] N. Pradhan, D. Goorskey, J. Thessing, X. Peng, Journal of the American Chemical Society 127, 17586 (2005).
[10] R. N. Bhargava, D. Gallagher, X. Hong, A. Nurmikko, Physical Review Letters 72, 416 (1994).
[11] C. A. Stowell, R. J. Wiacek, A. E. Saunders, B. A. Korgel, Nano Letters 3, 1441 (2003).
[12] S. C. Erwin et al., Nature 436, 91 (2005).
[13] Y. Yang, O. Chen, A. Angerhofer, Y. C. Cao, Journal of the American Chemical Society 128, 12428 (2006).
[14] C. Tuinenga, J. Jasinski, T. Iwamoto, V. Chikan, ACS Nano 2, 1411 (2008).
[15] S. Roy et al., The Journal of Physical Chemistry C 113, 13008 (2009).
[16] R. Xie, X. Peng, Journal of the American Chemical Society 131, 10645 (2009).
[17] T. Mokari, A. Aharoni, I. Popov, U. Banin, Angewandte Chemie International Ed. 45, 8001 (2006).

SUMMARY OF THE INVENTION

Doping of semiconductor materials by impurity atoms enables their widespread application in micro- and optoelectronics. However, for strongly confined colloidal semiconductor nanocrystals, doping has proven elusive. This arises both from the synthetic challenge of how to introduce single impurities and from a lack of fundamental understanding of this heavily doped limit under strong quantum confinement. Herein, provided are heavily doped colloidal semiconductor nanocrystals and a process for their preparation, namely for intentionally introducing (doping) an impurity such as metal atoms/ions impurities, generally referred to as a dopant material, to semiconductor nanoparticles, providing control of band gap, Fermi energy and presence of charge carriers. A combination of optical measurements, scanning tunneling spectroscopy and theory reveal the emergence of a confined impurity band and band-tailing. Successful control of doping provided n- and p-doped semiconductor nanoparticles which greatly enhance the potential application of such materials in solar cells, thin-film transistors, opto-electronic devices and other devices and applications.

Thus, the invention generally provides a nanoparticle of a material comprising a semiconductor material (herein referred to as the nanoparticle material), the semiconductor material being doped with at least one dopant material (two or more atoms thereof), wherein said dopant material is dispersed within said semiconductor material so as to alter the density of states of said nanoparticle material.

In one aspect of the invention, there is provided a nanoparticle material comprising a semiconductor material, the semiconductor material being doped with at least two atoms of a dopant material, wherein said at least two atoms of a dopant material are dispersed within said semiconductor material, inducing charge carriers in said nanoparticle material (in the regime of heavy doping in which the impurities charge carriers interact with each other).

In another aspect, a nanoparticle is provided, comprising a semiconductor material, the semiconductor material being doped with at least two atoms of a dopant material, wherein said atoms of the dopant material are heterovalent to atoms of the semiconductor material, said at least two atoms of a dopant material being dispersed within said semiconductor material.

The invention also provides a nanoparticle comprising a semiconductor material, the semiconductor material being doped with at least two atoms of a dopant material, wherein said atoms of the dopant material are heterovalent to atoms of the semiconductor material, said at least two atoms of a dopant material being dispersed within said semiconductor material altering the density of states (DOS) of said nanoparticle material.

In some embodiments, the nanoparticle of the invention is (consisting) of a semiconductor material.

Where the nanoparticle material comprises a semiconductor material and at least one other material (such as a metal and/or an insulator), each of the different materials may be present in the nanoparticles in discrete regions. In such embodiments, only regions composed of semiconducting materials are doped in accordance with the invention.

In some exemplary cases, the doped nanoparticles are characterized by a doped semiconducting material element (region) optionally having thereon spaced-apart regions of at least one metal/metal alloy material. In one example, the nanoparticle is a nanorod composed of at least one doped semiconductor material, the surface of which being spotted with one or more spaced-apart islands or dots of at least one metal/metal alloy. The islands may be of the same or different metal/metal alloy material. In another example, a nanorod of a doped semiconductor material is provided, the nanorods having on one of its termini a metal/metal alloy region and on its doped semiconductor surface spaced-apart metal/metal alloy islands or dots which may or may not be of a single material and which may or may not be of the same material as the metal/metal alloy at the terminus.

Thus, the nanoparticles may be hybrid nanoparticles comprising each at least one metal/metal alloy region and at least one doped semiconductor region.

The "nanoparticle" (or nanocrystal) being doped in accordance with the present invention, is a colloidal nanoparticle of at least one semiconductor material, wherein the nanoparticle dimensions (diameter or length) are at the nanometric range (between 1 and 1000 nm). In some embodiments, the nanoparticles of the invention are between 1 nm to 50 nm in length or diameter. In other embodiments, the doped nanoparticles are on average in the range of 1 nm to 20 nm in length or diameter. In other embodiments, the doped nanoparticles are on average in the range of 1 nm to 10 nm in length or diameter.

Where the nanoparticles are constructed of at least one region of a doped semiconductor material (such as a nanorod element) and at least one other region of a different material (such as a metal and/or an insulator), the size (diameter or length) of the doped semiconductor region (e.g., the nanorod element) is between 1 nm to 50 nm in length or diameter. In some embodiments, the doped region is on average in the range of 1 nm to 20 nm in length or diameter. In other embodiments, the doped region is on average in the range of 1 nm to 10 nm in length or diameter.

The undoped nanoparticles may be any one or more colloidal nanoparticles known in the art. The undoped nanoparticles may be those disclosed in any of the following:

1. Semiconductor nanocrystals as disclosed in WO 2002/25745 and US application no. 2003/010987, herein incorporated by reference;
2. Core-heteroshell nanocrystals as disclosed in WO 2006/134599 and US application no. 2009/230382, herein incorporated by reference;
3. Hybrid metal semiconductor nanocrystals as disclosed in WO 2008/102351 and US application no. 2010/044209, herein incorporated by reference;
4. Nanocrystalline rods as disclosed in WO 2003/097904 and U.S. Pat. No. 6,788,453, herein incorporated by reference; and WO 2005/075339 and US applications nos. 2005/167646 and 2008/128761, herein incorporated by reference;
5. Cage hybrid nanocrystals as disclosed in WO 2011/033510 and its corresponding US application, herein incorporated by reference; and
6. Any other nanoparticle comprising semiconductor material known in the art.

In some embodiments, the nanoparticles are selected amongst isotropic and anisotropic shaped nanoparticles. The nanoparticles may be selected to display any branched and net structures. Without being limited thereto, the nanoparticles may be symmetrical or unsymmetrical, may be elongated having a rod-like shape, round (spherical), elliptical, branch, network or any irregular shape. In some embodiments, the nanoparticles are selected from quantum dots (QD), nanocrystals, nanospheres, nanorods, branched nanoparticles, multipods such as tetrapod and others.

In some embodiments, the nanoparticles are quantum dots (QD) of so-called 0 dimension (0D), or quantum rods being intermediate systems between 0D to 1D. In some embodiments, the QD are selected to have a size range from several nanometers to a hundred nanometers. In some embodiments, the QDs are 2 nm to 20 nm in diameter.

As stated above, the nanoparticle may comprise one or more regions, wherein at least one is a doped semiconductor material region. In some embodiments, the different semiconductor regions are doped with the same or different dopants (type and/or concentration).

The nanoparticle material, namely—the material from which the nanoparticles are formed, or the semiconductor material which the nanoparticle comprises is a semiconductor material selected from elements of Group I-VII, Group II-VI, Group III-V, Group IV-VI, Group III-VI, and Group IV semiconductors and combinations thereof.

In some embodiments, the semiconductor material is a Group I-VII semiconductor, being selected from CuCl, CuBr, CuI, AgCl, AgBr, AgI and the like.

In other embodiments, the semiconductor material is a Group II-VI material, being selected from CdSe, CdS, CdTe, ZnSe, ZnS, ZnTe, HgS, HgSe, HgTe, CdZnSe, ZnO and any combination thereof.

In further embodiments, the semiconductor is a Group III-V material, being selected from InAs, InP, InN, GaN, InSb, InAsP, InGaAs, GaAs, GaP, GaSb, AlP, AlN, AlAs, AlSb, CdSeTe, ZnCdSe and any combination thereof.

In additional embodiments, the semiconductor material is selected from Group IV-VI materials, such as PbSe, PbTe, PbS, PbSnTe, $Tl_2SnTe_5$ and any combination thereof.

The semiconductor material may alternatively comprise an element of Group IV. In some embodiments, the element is selected from C, Si and Ge.

In some embodiments, the nanoparticle material is a semiconductor material selected from CdSe, CdS, CdTe, ZnSe, ZnS, ZnTe, HgS, HgSe, HgTe, CdZnSe, InAs, InP, InN, GaN, InSb, InAsP, InGaAs, GaAs, GaP, GaSb, AlP, AlN, AlAs, AlSb, CdSeTe, ZnCdSe, PbSe, PbTe, PbS, PbSnTe, $Tl_2SnTe_5$, $RuS_2$, $RuO_2$, $MoS_2$, $MoO_3$, $RhS_2$, $RuO_4$, $WS_2$, and $WO_2$, $Cu_2S$, $Cu_2Se$, $Cu_2Te$, $CuInS_2$, $CuInSe_2$, $CuInTe_2$ or any combination thereof.

In further embodiments, the semiconductor is selected from InAs, InP, InN, GaN, InSb, InAsP, InGaAs, GaAs, GaP, GaSb, AlP, AlN, AlAs, AlSb, CdSeTe, ZnCdSe and any combination thereof. In further embodiments, the semiconductor material is selected from InAs, GaAs, GaP, GaSb, InP, InSb, AlAs, AlP, AlSb and InGaAs. In other embodiments, the material is InAs.

The nanoparticles are doped with at least two dopant atoms of a material capable of inducing charge carriers therein. Thus, in most general terms, the "dopant" refers to an atom or an ion which is heterovalent to the atoms of the nanoparticle material. In other words, the dopant is selected amongst materials which differ from the atoms composing the nanoparticle material by one or more valance electron(s). The dopant material may be selected amongst metals and non-metal materials. In some embodiments, the dopant material is different from Mn atoms or ions.

In some embodiments, the dopant atom or ions are of Li or Mg or Na or K or Rb or Cs or Be or Ca or Sr or Ba, Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or P or As or Sb or Bi or O or S or Se or Te or Po or F or Cl or Br or I or At, or any combination thereof.

The dopant material precursors as used in the processes of the invention may be selected amongst a metal halide (chloride, bromide or iodide), a metal halide (chloride, bromide or iodide) hydrate, a metal acetate, a metal acetate hydrate, a metal acetylacetonates, a metal acetylacetonates hydrate, a metal carboxylate, a metal carboxylate hydrate, a metal nitrate, a metal nitrate hydrate, a metal nitrite, a metal nitrite hydrate, a metal cyanate, a metal cyanate hydrate, a metal sulfide, a metal sulfide hydrate, a metal sulfite, a metal sulfite hydrate, a metal hyposulfite, a metal hyposulfite hydrate, a metal sulfate, a metal sulfate hydrate, a metal thiosulfate, a metal thiosulfate hydrate, a metal dithionite, a metal dithionite hydrate, a metal phosphate, a metal phosphate hydrate, a metal carbonate, a metal carbonate hydrate, a metal hypochlorite/chlorite/chlorate/cerchlorate, a metal hypochlorite/chlorite/chlorate/perchlorate hydrate, a metal hypobromite/bromite/bromate/berbromate, a metal hypobromite/bromite/bromate/perbromate, a metal hypoiodite/iodite/iodate/periodate, a metal hypochlorite/chlorite/chlorate/perchlorate, a metal alkyl, a metal alkoxide, a metal amine, a metal phosphine, and a metal thiolate.

Non-limiting examples of such metal precursors include (where "M" represents the metal atom):
  acetates (the group $CH_3COO^-$, abbreviated $AcO^-$) selected from AcOM, $AcO_2M$, $AcO_3M$, and $AcO_4M$;
  acetates hydrates (the group $CH_3COO^-$, abbreviated $AcO^-$) selected from $AcOM.xH_2O$, $AcO_2M.xH_2O$, $AcO_3M.xH_2O$, and $AcO_4M.xH_2O$, wherein x varies based on the nature of M;
  acetylacetonates (the group $C_2H_7CO_2^-$, abbreviated $AcAc^-$) selected from AcAcM, $AcAc_2M$, $AcAc_3M$, and $AcAc_4M$;
  acetylacetonate hydrates (the group $C_2H_7CO_2^-$, abbreviated $AcAc^-$) selected from $AcAcM.xH_2O$, $AcAc_2M.xH_2O$, $AcAc_3M.xH_2O$, and $AcAc_4M.xH_2O$, wherein x varies based on the nature of M;
  chlorides selected from MCl, $MCl_2$, $MCl_3$, $MCl_4$, $MCl_5$, and $MCl_6$;
  chlorides hydrates selected from $MCl.xH_2O$, $MCl_2.xH_2O$, $MCl_3.xH_2O$, $MCl_4.xH_2O$, $MCl_5.xH_2O$, and $MCl_6.xH_2O$, wherein x varies based on the nature of M;
  bromides selected from MBr, $MBr_2$, $MBr_3$, $MBr_4$, $MBr_5$, and $MBr_6$;
  bromides hydrates selected from $MBr.xH_2O$, $MBr_2.xH_2O$, $MBr_3.xH_2O$, $MBr_4.xH_2O$, $MBr_5.xH_2O$, and $MBr_6.xH_2O$, wherein x varies based on the nature of M;
  iodides selected from MI, $MI_2$, $MI_3$, $MI_4$, $MI_5$, and $MI_6$;
  iodides hydrates selected from $MI.xH_2O$, $MI_2.xH_2O$, $MI_3.xH_2O$, $MI_4.xH_2O$, $MI_5.xH_2O$, and $MI_6.xH_2O$, wherein x varies based on the nature of M;
  carboxylates (abbreviated $RCO_2^-$, and including acetates) selected from $MRCO_2$, $M(RCO_2)_2$, $M(RCO_2)_3$, $M(RCO_2)_4$, $M(RCO_2)_5$, and $M(RCO_2)_6$;
  carboxylates hydrates (abbreviated $RCO_2^-$) selected from $MRCO_2.xH_2O$, $M(RCO_2)_2.xH_2O$, $M(RCO_2)_3.xH_2O$, $M(RCO_2)_4.xH_2O$, $M(RCO_2)_5.xH_2O$, and $M(RCO_2)_6.xH_2O$, wherein x varies based on the nature of M;
  nitrates selected from $MNO_3$, $M(NO_3)_2$, $M(NO_3)_3$, $M(NO_3)_4$, $M(NO_3)_5$, and $M(NO_3)_6$;
  nitrates hydrates selected from $MNO_3.xH_2O$, $M(NO_3)_2.xH_2O$, $M(NO_3)_3.xH_2O$, $M(NO_3)_4.xH_2O$, $M(NO_3)_5.xH_2O$, and $M(NO_3)_6.xH_2O$, wherein x varies based on the nature of M;
  nitrites selected from $MNO_2$, $M(NO_2)_2$, $M(NO_2)_3$, $M(NO_2)_4$, $M(NO_2)_5$, and $M(NO_2)_6$;
  nitrites hydrates selected from $MNO_2.xH_2O$, $M(NO_2)_2.xH_2O$, $M(NO_2)_3.xH_2O$, $M(NO_2)_4.xH_2O$, $M(NO_2)_5.xH_2O$, and $M(NO_2)_6.xH_2O$, wherein x varies based on the nature of M;
  cyanates selected from MCN, $M(CN)_2$, $M(CN)_3$, $M(CN)_4$, $M(CN)_5$, $M(CN)_6$;
  cyanates hydrates selected from $MCN.xH_2O$, $M(CN)_2.xH_2O$, $M(CN)_3.xH_2O$, $M(CN)_4.xH_2O$, $M(CN)_5.xH_2O$, and $M(CN)_6.xH_2O$, wherein x varies based on the nature of M;
  sulfides selected from $M_2S$, MS, $M_2S_3$, $MS_2$, $M_2S_2$, $MS_3$, $M_3S_4$, $MS_5$, and $M_2S_7$;
  sulfides hydrates selected from $M_2S.xH_2O$, $MS.xH_2O$, $M_2S_3.xH_2O$, $MS_2.xH_2O$, $M_2S_2.xH_2O$, $MS_3.xH_2O$, $M_3S_4.xH_2O$, $MS_5.xH_2O$, and $M_2S_7.xH_2O$, wherein x varies based on the nature of M;
  sulfites selected from $M_2SO_3$, $MSO_3$, $M_2(SO_3)_3$, $M(SO_3)_2$, $M_2(SO_3)_2$, $M(SO_3)_3$, $M_3(SO_3)_4$, $M(SO_3)_5$, and $M_2(SO_3)_7$;
  sulfites hydrates selected from $M_2SO_3.xH_2O$, $MSO_3.xH_2O$, $M_2(SO_3)_3.xH_2O$, $M(SO_3)_2.xH_2O$, $M_2(SO_3)_2.xH_2O$, $M(SO_3)_3.xH_2O$, $M_3(SO_3)_4.xH_2O$, $M(SO_3)_5.xH_2O$, and $M_2(SO_3)_7.xH_2O$, wherein x varies based on the nature of M;
  hyposulfite selected from $M_2SO_2$, $MSO_2$, $M_2(SO_2)_3$, $M(SO_2)_2$, $M_2(SO_2)_2$, $M(SO_2)_3$, $M_3(SO_2)_4$, $M(SO_2)_5$, and $M_2(SO_2)_7$;
  hyposulfite hydrates selected from $M_2SO_2.xH_2O$, $MSO_2.xH_2O$, $M_2(SO_2)_3.xH_2O$, $M(SO_2)_2.xH_2O$, $M_2(SO_2)_2.xH_2O$, $M(SO_2)_3.xH_2O$, $M_3(SO_2)_4.xH_2O$, $M(SO_2)_5.xH_2O$, and $M_2(SO_2)_7.xH_2O$, wherein x varies based on the nature of M;
  sulfate selected from $M_2SO_3$, $MSO_3$, $M_2(SO_3)_3$, $M(SO_3)_2$, $M_2(SO_3)_2$, $M(SO_3)_3$, $M_3(SO_3)_4$, $M(SO_3)_5$, and $M_2(SO_3)_7$;
  sulfate hydrates selected from $M_2SO_3.xH_2O$, $MSO_3.xH_2O$, $M_2(SO_3)_3.xH_2O$, $M(SO_3)_2.xH_2O$, $M_2(SO_3)_2.xH_2O$, $M(SO_3)_3.xH_2O$, $M_3(SO_3)_4.xH_2O$, $M(SO_3)_5.xH_2O$, and $M_2(SO_3)_7.xH_2O$, wherein x varies based on the nature of M;
  thiosulfate selected from $M_2S_2O_3$, $MS_2O_3$, $M_2(S_2O_3)_3$, $M(S_2O_3)_2$, $M_2(S_2O_3)_2$, $M(S_2O_3)_3$, $M_3(S_2O_3)_4$, $M(S_2O_3)_5$, and $M_2(S_2O_3)_7$;
  thiosulfate hydrates selected from $M_2S_2O_3.xH_2O$, $MS_2O_3.xH_2O$, $M_2(S_2O_3)_3.xH_2O$, $M(S_2O_3)_2.xH_2O$, $M_2(S_2O_3)_2.xH_2O$, $M(S_2O_3)_3.xH_2O$, $M_3(S_2O_3)_4.xH_2O$, $M(S_2O_3)_5.xH_2O$, and $M_2(S_2O_3)_7.xH_2O$, wherein x varies based on the nature of M;

dithionites selected from $M_2S_2O_4$, $MS_2O_4$, $M_2(S_2O_4)_3$, $M(S_2O_4)_2$, $M_2(S_2O_4)_2$, $M(S_2O_4)_3$, $M_3(S_2O_4)_4$, $M(S_2O_4)_5$, and $M_2(S_2O_4)_7$;

dithionites hydrates selected from $M_2S_2O_4 \cdot xH_2O$, $MS_2O_4 \cdot xH_2O$, $M_2(S_2O_4)_3 \cdot xH_2O$, $M(S_2O_4)_2 \cdot xH_2O$, $M_2(S_2O_4)_2 \cdot xH_2O$, $M(S_2O_4)_3 \cdot xH_2O$, $M_3(S_2O_4)_4 \cdot xH_2O$, $M(S_2O_4)_5 \cdot xH_2O$, and $M_2(S_2O_4)_7 \cdot xH_2O$, wherein x varies based on the nature of M;

phosphates selected from $M_3PO_4$, $M_3(PO_4)_2$, $MPO_4$, and $M_4(PO_4)_3$;

phosphates hydrates selected from $M_3PO_4 \cdot xH_2O$, $M_3(PO_4)_2 \cdot xH_2O$, $MPO_4 \cdot xH_2O$, and $M_4(PO_4)_3 \cdot xH_2O$, wherein x varies based on the nature of M;

carbonates selected from $M_2CO_3$, $MCO_3$, $M_2(CO_3)_3$, $M(CO_3)_2$, $M_2(CO_3)_2$, $M(CO_3)_3$, $M_3(CO_3)_4$, $M(CO_3)_5$, $M_2(CO_3)_7$;

carbonate hydrates selected from $M_2CO_3 \cdot xH_2O$, $MCO_3 \cdot xH_2O$, $M_2(CO_3)_3 \cdot xH_2O$, $M(CO_3)_2 \cdot xH_2O$, $M_2(CO_3)_2 \cdot xH_2O$, $M(CO_3)_3 \cdot xH_2O$, $M_3(CO_3)_4 \cdot xH_2O$, $M(CO_3)_5 \cdot xH_2O$, and $M_2(CO_3)_7 \cdot xH_2O$, wherein x varies based on the nature of M;

hypochlorites/chlorites/chlorates/cerchlorates (abbreviated $ClO_n^-$, n=1, 2, 3, 4) selected from $MClO_n$, $M(ClO_n)_2$, $M(ClO_n)_3$, $M(ClO_n)_4$, $M(ClO_n)_5$, and $M(ClO_n)_6$;

hypochlorites/chlorites/chlorates/perchlorates hydrates selected from $MClO_n \cdot xH_2O$, $M(ClO_n)_2 \cdot xH_2O$, $M(ClO_n)_3 \cdot xH_2O$, $M(ClO_n)_4 \cdot xH_2O$, $M(ClO_n)_5 \cdot xH_2O$, and $M(ClO_n)_6 \cdot xH_2O$, wherein x varies based on the nature of M, and n=1, 2, 3, 4;

hypobromites/bromites/bromates/berbromates (abbreviated $BrO_n^-$, n=1, 2, 3, 4) selected from $MBrO_n$, $M(BrO_n)_2$, $M(BrO_n)_3$, $M(BrO_n)_4$, $M(BrO_n)_5$, and $M(BrO_n)_6$;

hypobromites/bromites/bromates/perbromates hydrates selected from $MBrO_n \cdot xH_2O$, $M(BrO_n)_2 \cdot xH_2O$, $M(BrO_n)_3 \cdot xH_2O$, $M(BrO_n)_4 \cdot xH_2O$, $M(BrO_n)_5 \cdot xH_2O$, and $M(BrO_n)_6 \cdot xH_2O$, wherein x varies based on the nature of M, and n=1, 2, 3, 4;

hypoiodites/iodites/iodates/periodates (abbreviated $IO_n^-$, n=1, 2, 3, 4) selected from $MIO_n$, $M(IO_n)_2$, $M(IO_n)_3$, $M(IO_n)_4$, $M(IO_n)_5$, and $M(IO_n)_6$; and hypochlorites/chlorites/chlorates/perchlorates hydrates selected from $MIO_n \cdot xH_2O$, $M(IO_n)_2 \cdot xH_2O$, $M(IO_n)_3 \cdot xH_2O$, $M(IO_n)_4 \cdot xH_2O$, $M(IO_n)_5 \cdot xH_2O$, and $M(IO_n)_6 \cdot xH_2O$, wherein x varies based on the nature of M, and n=1, 2, 3, 4.

In some embodiments, the metal precursors are selected in a non-limiting fashion from CuCl, $CuCl_2$, $PdCl_2$, $PtCl_2$, $InCl_3$, HgCl, $HgCl_2$, and $SnCl_2$; metal nitrates from $AgNO_3$, $Cu(NO_3)_2$ and $Pb(NO_3)_2$; metal acetylacetonates (acac) from copper acetylacetonate $(Cu(acac)_2)$, $Ru(acac)_2$, and $Al(acac)_3$; and others. For non-metal elements, the precursors may be selected in a non-limiting fashion from tris (trimethylsilyl)phosphine ($[(CH_3)_3Si]_3P$), tris(trimethylsilyl)arsine, bis(trimethylsilyl)sulfide $((CH_3)_3Si)_2S$, bis(diethylamino)chlorophosphine, trioctylphosphine selenide, trioctylphosphine telluride; diphenyl disulfide diphenyldiselenide.

In some embodiments, the nanoparticle of the invention is not doped by Mn atoms or ions. In another embodiment, the nanoparticle of the invention is not a dilute magnetic semiconductor nanoparticle.

In some embodiments, the dopant is selected from Ag and Cu.

In further embodiments, the nanoparticle material is InAs and said dopant is selected from Ag and Cu.

The dopant atoms are dispersed within the nanoparticle material and are not collected as dopant islands or domains (material aggregate) within or on the surface of the nanoparticle. The "dispersed" state thus refers to a distribution of the dopant atoms within the nanoparticle material such that the nanoparticles remain free of dopant domains, as further demonstrated herein, within the nanoparticles or on their surface.

As stated herein, the doped nanoparticles of the invention are regarded as being "heavily doped", namely the dopant concentration being between $1 \times 10^{18}$ atoms per $cm^3$ to $1 \times 10^{23}$ atoms per $cm^3$. In some embodiments, the number of dopant atoms in the nanoparticles ranges from $1 \times 10^{19}$ atoms per $cm^3$ to $1 \times 10^{22}$ atoms per $cm^3$. In further embodiments, the number of dopant atoms in the nanoparticles ranges from $1 \times 10^{19}$ atoms per $cm^3$ to $1 \times 10^{21}$ atoms per $cm^3$. In additional embodiments, the number of dopant atoms in the nanoparticles ranges from $1 \times 10^{19}$ atoms per $cm^3$ to $1 \times 10^{20}$ atoms per $cm^3$.

In some embodiments, the number of dopant atoms ranges from 2 dopant atoms per nanoparticle up to 15% doping atoms relative to atoms of the nanoparticle material.

In some embodiments, the number of dopant atoms per nanoparticle is between 2 to 500 dopant atoms per nanoparticle. In further embodiments, the number of dopant atoms per nanoparticle is between 2 to 200 dopant atoms per nanoparticle. In additional embodiments, the number of dopant atoms per nanoparticle is between 2 to 100 atoms per nanoparticle, or between 5 to 100, or between 5 to 50, or between 5 to 50, or between 5 to 50, or between 5 to 50, or between 5 to 40, or between 5 to 30, or between 5 to 20, or between 5 to 10, or between 2 to 50, or between 2 to 40, or between 2 to 30, or between 2 to 20, or between 2 to 10, or between 10 to 100 dopant atoms per nanoparticle.

In other embodiments, the number of dopant atoms is less than 15% of the number of atoms of the nanoparticle material.

In other embodiments, the number of dopant atoms is between 1% and 15% of the number of atoms of the nanoparticle material. In further embodiments, the number of dopant atoms is between 5% and 15% of the number of atoms of the nanoparticle material. In other embodiments, the number of dopant atoms is between 10% and 15% of the number of atoms of the nanoparticle material.

In further embodiments, the number of dopant atoms is 1%, 2%, 3%, 4%, 5%, 6%, 7%, 8%, 9%, 10%, 11%, 12%, 13%, 14% or 15% of the number of atoms of the semiconductor material.

The presence of the dopant atoms in the nanoparticle material induces charge carriers in the nanoparticle, alters the material density of states and the Fermi energy level, thus also altering the position of the band gap as measured in the absorption spectrum or emission spectrum. Without wishing to be bound by theory, the electronic structure of the doped nanoparticle is controlled by the nature of the dopant material with respect to the host nanoparticle material. In case the dopant donates charge carriers (electrons or holes) to the nanocrystal electronic structure an n-type or p-type nanocrystals are formed. Thus, the nanoparticles of the invention may be utilized as n-doped materials (having negative charge carriers) or as p-doped materials (having positive charge carriers), depending on the dopant type.

The fabrication of n-doped and p-doped materials and the ability to control the density of states of an undoped nanoparticle material, e.g., by the addition of one to hundreds of states, permits the tailoring of a variety of nanoparticles for a variety of applications. The nanoparticles of the invention may be utilized in the constructions of a multitude of electronic and optoelectronic devices such as a diode; a transistor; a bipolar transistor (a type selected from n-p-n, p-n-p and n-i-p); an electronic circuit component; an integrated circuit; a detector; a switch; an amplifier; a transducer; a laser; a tag; a biological tag; a photoconductor; a photodiode; a photovoltaic cell; a light emitting diode (LED); a light sensor; a display; and a large area display array.

In another aspect, the invention provides a method for manufacturing nanoparticles according to the present invention. The process generally comprises doping a pre-made population of undoped nanoparticles with two or more atoms of a doping material, as disclosed herein. In some embodiments, the process of the invention is provided for controlling the density of states of a nanoparticle material.

The method thus comprises:
obtaining a dispersion of undoped nanoparticles;
contacting said undoped nanoparticles with at least one dopant or dopant precursor material under conditions permitting dispersion of said dopant within the nanoparticle, to obtain a nanoparticle doped with at least two atoms of said dopant, as defined herein, wherein said dopant alters the density of states of said nanoparticle material.

In some embodiments, the contacting of said pre-made nanoparticles at the undoped state with said at least one dopant comprises:
obtaining a solution of at least one dopant or dopant precursor;
adding said solution to said dispersion of undoped nanoparticles or vice versa; and
permitting said dopant to intercalate within said nanoparticle material to thereby obtain a nanoparticle according to the invention (doped state).

In some embodiments, the solution of said at least one dopant or dopant precursor is an organic solution. In other embodiments, the method is carried out at room temperature.

The nanoparticles employed in accordance with the invention may be associated (coated) with surface ligands, typically organic ligands. Such organic ligands are selected to affect one or more physical or chemical characteristic, e.g., solubility of the particles. The ligands substitution on the surface of the nanoparticles may be altered depending on the specific application. For certain applications, the nanoparticle material may be treated to associate chemically or physically with one or more functionalities, such as biologically or chemically active molecules.

In some embodiments, the undoped nanoparticles are coated, partially or wholly with a plurality of passivating ligands. These ligands may be selected from trioctylphosphine (TOP), tributylphosphine (TBP), trioctylphosphine oxide (TOPO), dodecyl amine (DDA), didodecyldimethylammonium bromide (DDAB), tetradecyl amine (TDA), hexadecyl amine (HDA), octadecyl amine (ODA), oleic acid (OA), dodecylphosphonic acid (DDPA), tridecylphosphonic acid (TDPA), octadecylphosphonic acid (ODPA), hexylphosphonic acid (HPA) and thiols. Such ligands remain on the nanoparticles after doping.

In another aspect of the invention, there is provided a device comprising at least one nanoparticle or n-doped and p-doped material according to the present invention. The device may include a number of layers or regions each having a different doping material and/or doping concentration and may be arranged, for some applications in an alternating fashion wherein alternating layers/regions are of different dopant/semiconductor material or doping concentrations. A device may include a layer/region of a first doping type and one or more contact layers of second or further doping types on the layer.

In some embodiments, the device is a bipolar transistor in a form selected from n-p-n, p-n-p and n-i-p type transistor. In some embodiments, are provided Ag-doped InAs nanoparticles in p-type arrangement. In other embodiments, are provided Cu-doped InAs nanoparticles in n-type arrangement.

In further embodiments, the device is selected from a diode; a transistor; an electronic circuit component; an integrated circuit; a detector; a switch; an amplifier; a transducer; a laser; a tag; a biological tag; a photoconductor; a photodiode; a photovoltaic cell; a light emitting diode (LED); a light sensor; a display; and a large area display array.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 1 presents diagrams describing the effects of heavy doping in bulk and nanocrystal semiconductors.
FIG. 1B is a sketch for n-doped nanocrystal QD with confined energy levels. Light and dark lines correspond to the QD and impurity levels, respectively. Left panel: the level diagram for a single impurity effective mass model, where $E'_g$ is the quasi-particle gap in the doped QD, 1Se and 1Pe are the QD electron levels, and $E_d^{1S}$ and $E_d^{1P}$ are the impurity levels shifted below the corresponding QD levels by a shift D. Right panel: impurity levels develop into impurity bands as the number of impurities increases. Upper panel: sketch of the different impurity models.

FIG. 2 shows the optical properties of doped InAs NCs.
FIG. 2B shows normalized absorption spectra of three 3.3-nm InAs NC samples. Two of the samples had Cu (dotted line) and Ag (dashed line) solutions added to them resulting in metal/NC solution ratios of 540 and 264, respectively. These amounts correspond to 73 Cu atoms and 9 Ag atoms per NC. The third sample had a control solution (without metal salt) added to it (solid line). The inset shows the normalized emission spectra of these samples.

FIG. 3 provides sample spectra for Cu doping. The normalized absorption (FIGS. 2A-C) and emission spectra (FIGS. 3D-F) for 3.3 nm diameter InAs NCs to which increasing amounts of Cu solution were added. The Cu:NC solution ratios are as follows: panel (FIGS. 3A and 3D) 0, 85, 170, 260, 340; panel (FIGS. 3B and 3E) are 0, 425, 510, 600, 680; panel (FIGS. 3C and 3F) are 0, 770, 850.

FIG. 4 provides sample spectra for Ag doping. The normalized absorption (FIGS. 4A and 4B) and emission spectra (FIGS. 4C and 4D) for 3.3 nm diameter InAs NCs to which increasing amounts of Ag solution were added. The Ag:NC (nanocrystal) solution ratios in are as follows: panel (FIGS. 4A and 4C) 0, 50, 90, 170, 260; panel (FIGS. 4B and 4D) are 0, 332, 440, 850, 1000.

FIG. 5 is the number of Cu atoms per NC. Extracted values from ICP-AES (Inductively coupled plasma atomic emission spectroscopy) measurements against the Cu:NC solution ratio for NCs with diameters of 2.7 nm (labeled A), 3.3 nm (labeled B), 3.6 nm (labeled C) and 4.1 nm (labeled D).

FIG. 6 demonstrates the number of Ag atoms per NC. The number of Ag atoms per NC extracted from ICP-AES measurements against the Ag:NC solution ratio for NCs with diameters of 2.7 nm (labeled A), 3.3 nm (labeled B), 4.1 nm (labeled C) and 5.0 nm (labeled D). The inset is an enlarged representation of the region where the Ag:NC solution ratio is less than 450.

FIG. 7 demonstrates the effect of doping on the STM (scanning tunneling microscopy) tunneling spectra. The effect of doping on the STM tunneling spectra is shown in four dI/dV versus V tunneling spectra at 4.2 K, of undoped (solid line), Au-doped (dash-dotted line), Cu-doped (dashed line), and Ag-doped (dotted line) InAs nanocrystals, nominally 4 nm in diameter. The doped QDs were taken from samples that had Ag, Cu, and Au atom/QD ratios corresponding to 15, 160, and 77, respectively. The vertical (V=0) dashed line is a guide to the eye, highlighting the relative shifts of the band edges in the doped samples in manner typical of p-doped and n-doped semiconductors for the Ag-doped and Cu-doped nanocrystals, respectively. The inset shows an STM image of a single (Ag-doped) QD on which STS (scanning tunneling spectroscopy) data were measured.

DETAILED DESCRIPTION OF EMBODIMENTS

The invention provides a family of novel doped nanoparticles and a process for their preparation, which permits doping semiconductor nanocrystals with doping atoms, and a specific embodiment relates to metal dopants. By changing the dopant type and concentration, exquisite control of the electronic properties, including the band gap and Fermi energy is achieved. The role of strong quantum confinement leading to localization of impurity levels, as well as disorder effects leading to band-tailing in small nanocrystals, have been studied experimentally and theoretically. The successful controlled doping provides n- and p-doped semiconductor nanocrystals which greatly enhance the potential application of such materials in solar cells, thin-film transistors, and optoelectronic devices.

Figure 1A:
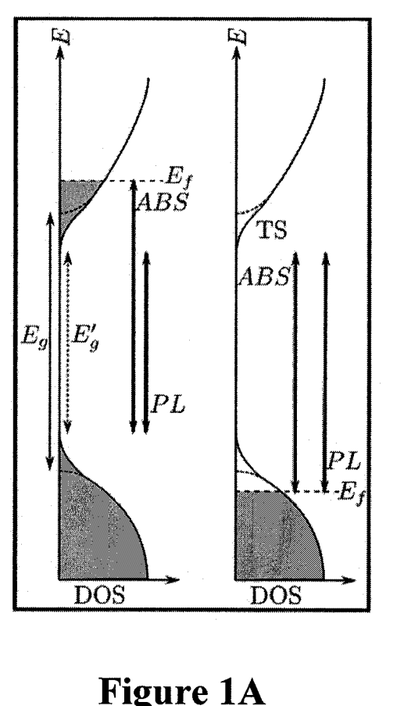
FIG. 1A shows a scheme of the different influences of doping a bulk semiconductor for n-type (left) and p-type (right) dopants. In the figure: ABS is absorption onset; PL is photoluminescence onset; TS is tail states; Ef is Fermi energy; $E'_g$ is modified band gap; and $E_g$ is unperturbed band gap. The shading shows state filling up to the Fermi energy.

The addition of even a single impurity atom to a semiconductor nanocrystal with a diameter of 4 nm, and which contains about 1,000 atoms, leads to a nominal doping level of $7 \times 10^{19}$ atoms per $cm^3$. In a bulk semiconductor this is already within an exceedingly highly-doped limit, where metallic ('degenerate') behavior is expected. Doping at this level in bulk semiconductors leads to the several effects summarized in FIG. 1A. First, at high doping levels the impurities interact with each other and an impurity sub-band emerges near the edge of the respective band (conduction or valence for n- or p-type, respectively). Often, tail states (Urbach tail) also develop due to distortions in the crystal structure. Effectively, the band gap, $E_g$, is narrowed. This may be probed by optical means where for highly doped n-type semiconductor (left frame in FIG. 1A) the absorption is blue shifted due to conduction band filling by the donated electrons (Moss-Burstein effect), and the emission emanating from the bottom of the conduction band is red-shifted. For high p-type doping, both absorption and emission are typically seen to be red-shifted due to the complexity of the valence band dominated by the band-tailing effect.

Figure 1B:
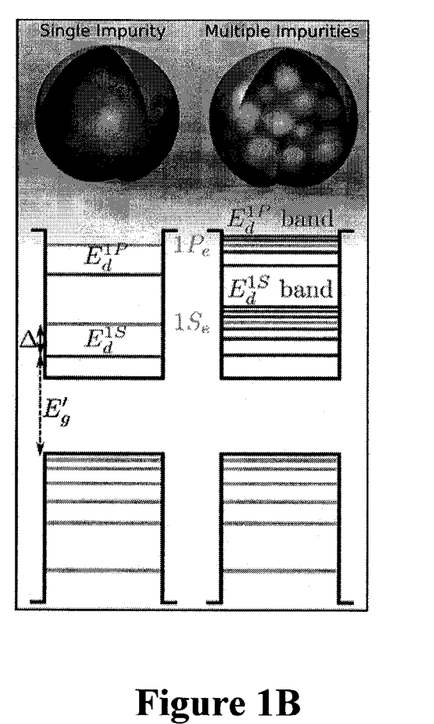

A dramatically different situation arises for electronic impurity doping of nanocrystals due to the discrete nature of the quantum confined states (FIG. 1B, for n-type doping). In this case the addition of a single dopant (left frame) significantly alters the density of states (DOS) due to the introduction of the impurity levels, a situation which is not expected for prior remote surface doping strategies. This has been described by a hydrogenic model under spherical confinement, leading to S- and P-like impurity states denoted by $E_d^{1S}$ and $E_d^{2P}$ that are several tens of meVs ($\Delta$) below the corresponding dot levels, effectively doubling the DOS near those energies. Even more intriguing is the system of the present invention, of multiple impurities in a single nanocrystal, which are inherently interacting due to the small volume and experience the effect of confining potential (FIG. 1B, right frame). Under these conditions of heavily doped semiconductor nanocrystals, the nature of delocalization and interaction of the impurity charge carriers may be greatly modified as compared to the bulk case. In addition, multiple impurities in a small confined nanocrystal can enhance disorder effects, altering the electronic structure via a quantum-confined Urbach tail mechanism.

Figure 2A:
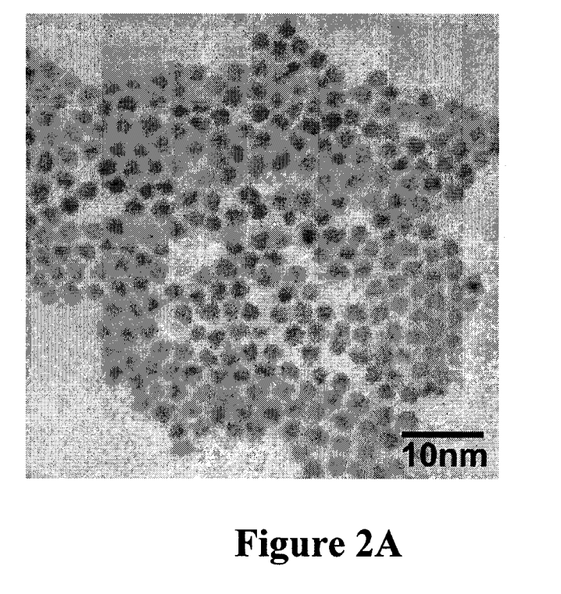
FIG. 2A is a TEM (transmission electron microscope) image of Ag-doped 3.3-nm InAs NCs.

To dope InAs nanocrystals with different impurity atoms, the inventors of the present invention have modified a reaction used for gold growth onto semiconductor nanoparticles [17], demonstrating phase separation between InAs and impurity metal regions (domains). As FIG. 2A shows, for nanoparticles prepared according to the present invention, at the impurity levels recited herein, it was not possible to identify the presence of metal regions (domains). This clearly indicates that the dopant atoms were dispersed. It should be noted that this was not the case for very high metal atom concentrations (~3000 atoms per QD in the reaction solution) prepared in accordance with prior processes [17], where TEM analysis clearly showed phase separation between InAs and impurity metal regions.

Further support for the dispersion of impurities is provided by X-ray diffraction (data not shown), where no fingerprints of metal domains were detected while the InAs crystal structure was generally maintained. Some broadening of the peaks was observed, ascribed to a small degree of structural disorder. X-ray photoelectron spectroscopy (XPS) measurements of these samples were also performed indicating the presence of dopant atoms (Ag, Au or Cu) in the respective samples (data not shown). This suggests successful addition of these atoms to the InAs QDs. Indeed, extrapolating the diffusion parameter values to room temperature gives a diffusion length scale for Au in InAs of ~$10^4$ nm/24 h, far greater than the QD diameter, and large values are also extrapolated for Ag and Cu in InAs at room temperature.

Figure 2B:
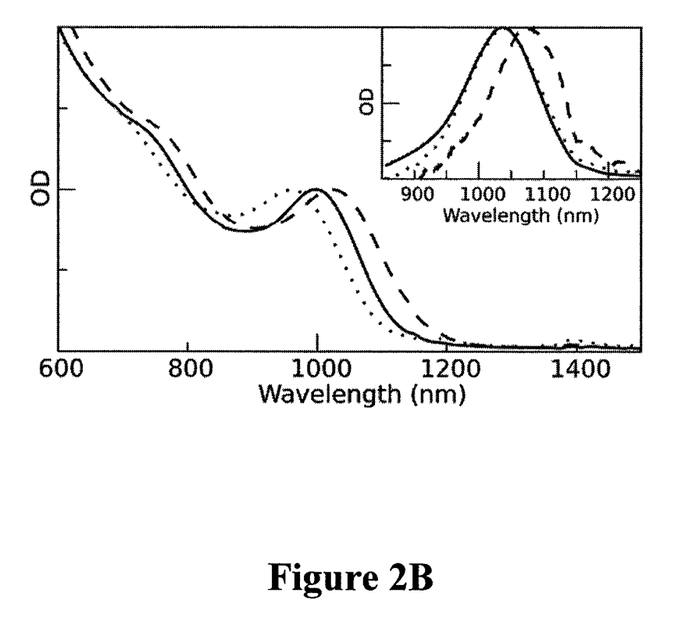

FIG. 2B shows the absorption and emission (inset) spectra of undoped and doped InAs QDs. The addition of Ag atoms resulted in a red-shift of both the first exciton absorption and the emission peaks. The addition of Cu resulted in a blue-shift of the first exciton absorption peak whereas the emission was not shifted. Addition of Au at similar concentrations did not significantly alter the observed optical gap neither in absorption nor in emission. The addition of any of these impurity atoms resulted in the gradual quenching of the emission from the QDs, yet the three impurities led to qualitatively different effects on the optical spectra and hence on the electronic properties of the doped QDs.

Figure 2C:
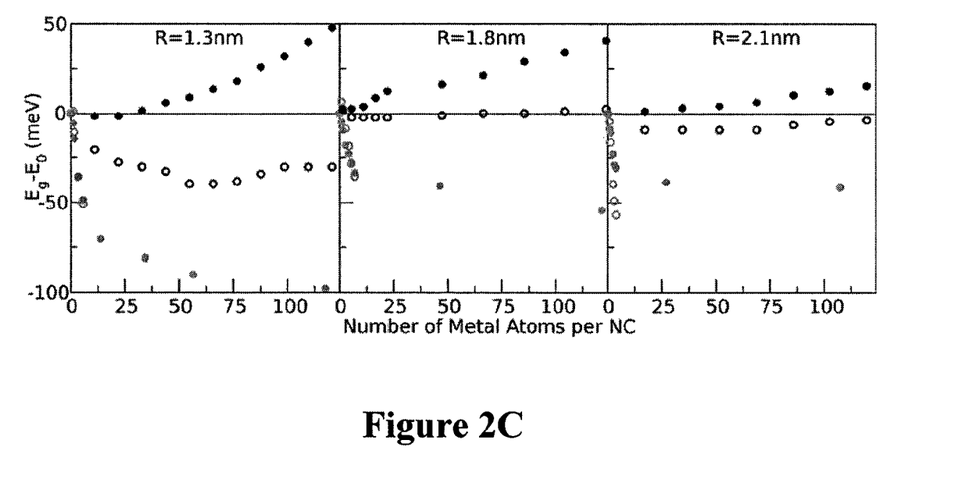
FIG. 2C shows The energetic shift of the first exciton peak (solid symbols) and the emission energy (open symbols) against the number of impurity atoms per QD for InAs NCs with radii of 1.3 nm (left), 1.8 nm (center), and 2.1 nm (right). Black symbols correspond to Ag doping, gray symbols to Cu.
Figure 3A:
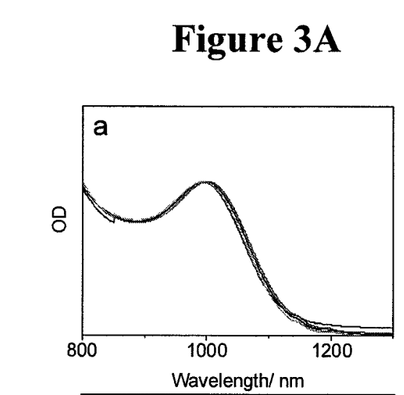
Figure 3B:
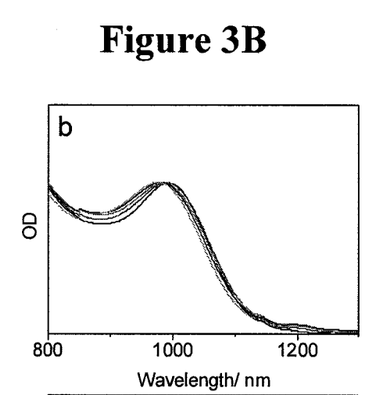
Figure 3C:
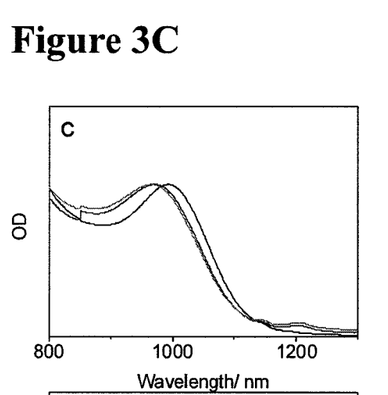
Figure 3D:
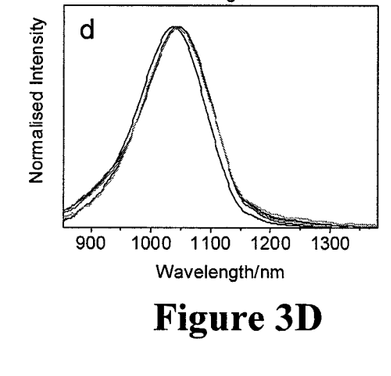
Figure 3E:
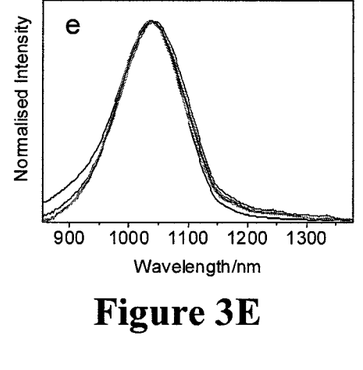
Figure 3F:
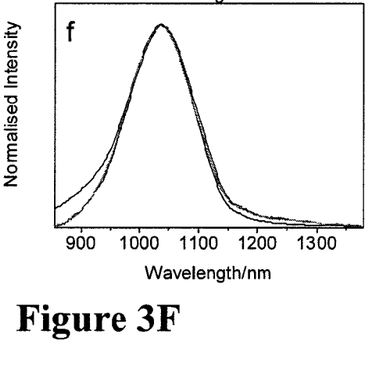
Figure 4A:
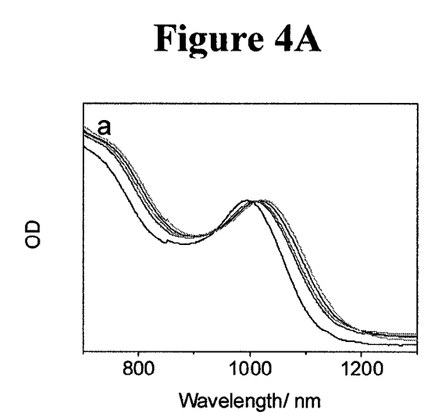
Figure 4B:
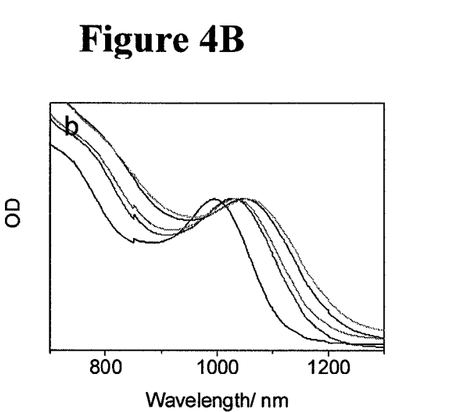
Figure 4C:
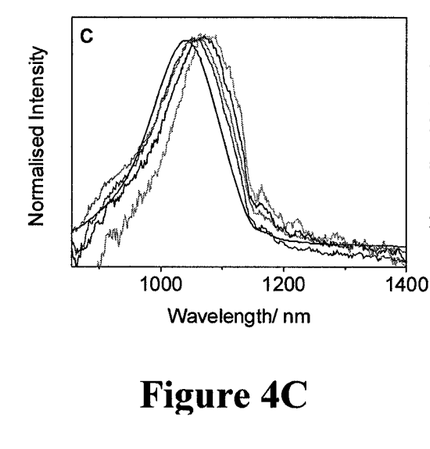
Figure 4D:
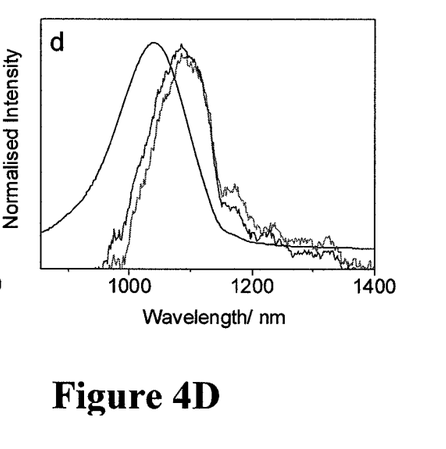

The effect of varying amounts of impurities on the first absorption peak and on the emission is shown in FIG. 2C for InAs QDs with different diameters, FIGS. 3 and 4 represents the individual spectra. The treatment of the InAs nanocrystals with the Cu solution led to an increase in the first exciton energy (FIG. 3A-C) while the emission energy was unchanged (FIG. 3D-F). Ag treatment led to a decrease in both the first exciton energy (FIG. 4A-B) and in the emission energy (FIG. 4C-D). All metal treatments resulted in some quenching of the emission. This was totally quenched after precipitation.

Figure 5:
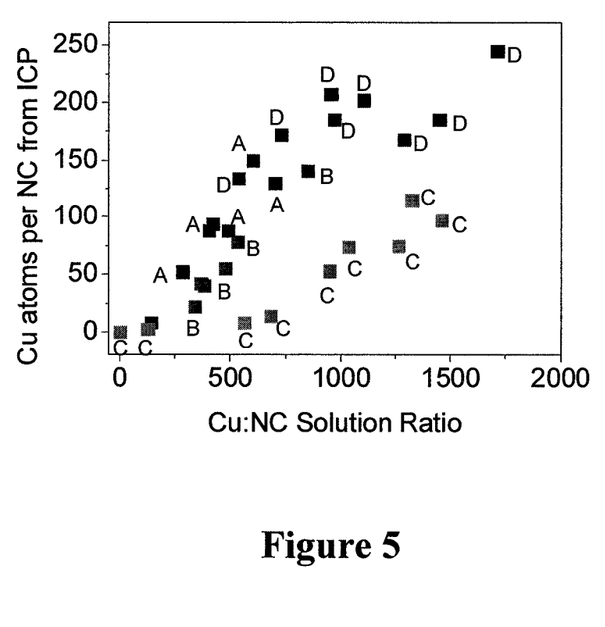
Figure 6:
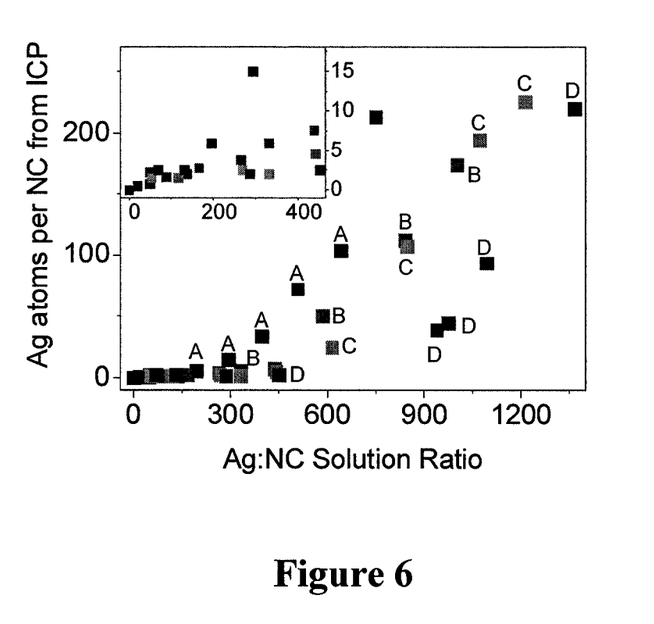

The amount of impurities in the QDs was estimated by the analytical method of inductively coupled plasma-atomic emission spectroscopy (ICP-AES, FIGS. 5-6). To perform this analysis, the doping reaction was carried out as described above on a range of NC sizes and at different metal precursors concentrations. The NCs were then precipitated using a non-solvent added to the solution and separated by centrifugation, dissolved using concentrated $HNO_3$ and diluted with triply distilled water. The relative quantities of In, As, Cu, Ag and Au in these solutions was measured by ICP-AES. The amount of Cu/Ag/Au per NC was extrapolated using the ratio of In and As to Cu/Ag/Au atoms together with the estimated number of In and As atoms per NC estimated from the NC size. The results are shown for Cu and Ag in FIG. 5 and FIG. 6. These graphs represent the number of metal atoms per NC extrapolated from the ICP measurements against the metal:NC solution ratio. FIG. 5 shows the dependence of the number of Cu atoms per NC on the Cu:NC solution ratio. For each size the results were fitted and the interpolated relationship was used to calibrate the number of Cu atoms per NC reported here. The number of Ag atoms per NC on the Ag:NC solution ratio showed two regimes as can be seen in FIG. 6.

Figure 7:
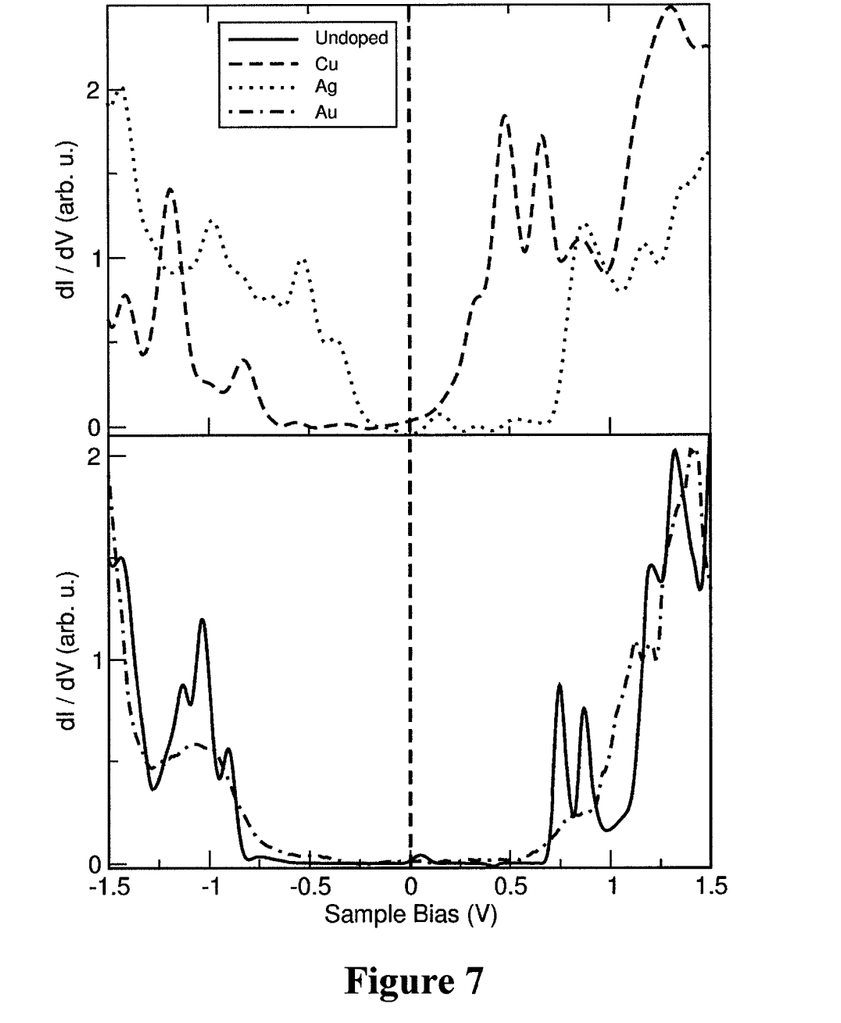

A first possible source of optical spectral shifts in such quantum confined particles may be related to size changes upon doping, but this was excluded by detailed sizing analysis (data not shown). An alternative source of the spectral shifts can be associated with electronic doping by the impurities. In FIG. 7 shown are the tunneling spectra measured by a scanning tunneling microscope (STM) at T=4.2K for undoped, Au-doped, Cu-doped and Ag-doped InAs QDs 4.2 nm in diameter. Starting from the reference case of the undoped QD shown in the lower panel, the dI/dV curves, which are proportional to the DOS (density of states), match earlier studies of InAs QDs. The gap region is clearly identified, while on the positive bias side a doublet of peaks associated with tunneling through the doubly degenerate $1S_e$ nanocrystal confined conduction band state is seen at the onset of the current, followed by higher order multiplet at higher bias corresponding to tunneling through the $1P_e$ conduction band state. A more complex peak structure is seen on the negative bias side, resulting from tunneling through the closely spaced and intricate valence band states of the InAs nanocrystal.

Several changes were seen upon doping the QDs. Starting with the case of Au, the gap was similar to the undoped NC, consistent with the optical measurements. However, the features in the scanning tunneling spectroscopy (STS) spectra were washed out, suggesting that indeed Au entered the nanocrystal, perturbing the pristine level structure. More significant changes were seen for both the Cu and Ag cases, presented in the upper panel. Significant band-tailing into the gap and emergence of in-gap states in regions covering nearly 40% of the gap region were observed. In particular, in the Cu case, a shoulder on a tail-state structure was seen at bias values just below the $1S_e$ conduction band doublet (which is remarkably preserved). Additionally, the doublet was superimposed on a notable rising background that increased to the region of the $1P_e$ peaks that are not well resolved. For the Ag-doped QDs, there was a significant broadening and merging of features on the positive bias side, and on the negative bias side a background signal develops.

A clear result of doping in bulk semiconductors was the shift of the Fermi level, which for n-type doping was close to the conduction band, and conversely, shifts to a lower energy close to the valence band, for p-type impurities. Remarkably, such shifts were clearly identified in the STS of the Cu and Ag doped QDs measured by the positions of the band edges relative to zero bias. While the zero bias position for the undoped case, as well as the Au doped case, was nearly centered in between the valence band and conduction band onsets, in the Cu-case the onset of the conduction band states nearly merges with the zero bias position. Considering that this relative shift corresponds to a relative measure of the Fermi level of the nanoparticle, this shift is clearly indicating n-type doping in this case. In contrast, for the Ag case, the zero bias was much closer to the onset of the valence band states. Therefore the Fermi level is now close to the valence band signifying p-type doping in this case.

Chemical considerations for the doping of InAs with the different metal atom impurities can help to understand these observations. Cu can have a formal oxidation state of either $Cu^{2+/1+}$. Moreover, its ionic radius is the smallest of the three impurities and therefore may be accommodated in interstitial sites within the InAs lattice. In such a case, one can expect that the Cu will partly donate its valence electrons to the QD (quantum dot) leading to n-type doping, consistent with the shift in the Fermi energy observed by STS. The incorporation of multiple impurities is expected to lead to the development of closely spaced impurity states, akin to the impurity band formed in the bulk. This band forms asymmetrically due to the disordered arrangement of the impurities in the QD, surpassing the energy of the $1S_e$ NC state. The observed rising background in the STS curve signifies the presence of such an impurity band. This is a direct indication of the substantial modification of the DOS induced by the impurities in small QDs, corresponding to very highly doped behavior in the bulk. Revisiting the observed blue shift in the absorption, this is in line with the filling of the conduction and asymmetric impurity-band levels in heavily n-type doped QD, leading to a Moss-Burstein blue-shift in the absorption spectrum and minor shifts in the emission (FIG. 2).

Ag has a large radius, and is considered to be a substitutional impurity in III-V semiconductors. The replacement of an In atom, which possesses three valence electrons, with a Ag atom, which has only one valence electron, leads to an electron deficiency in the bonding orbitals causing p-type doping. This is reflected in the shift of the Fermi level, as seen in the STS data (FIG. 7, dotted trace). In this case, the rising background in the spectrum at negative bias, indicates the formation of an impurity band near the valence band. Since Ag has the largest ionic radius of the three impurities, it distorts the crystal structure most significantly; this results in band-tailing analogous to the Urbach tail known for highly doped bulk semiconductors, and leading to the red shifts observed in the absorption onset as well as the emission (FIG. 2). Au may adopt a +3 valence state, which makes it isovalent with In and hence doping is not expected to lead to the introduction of charge carriers. Moreover, its size is comparable to that of the In, allowing for substitutional doping without significant lattice distortions. These features of Au are consistent with the absence of significant shifts in absorption, emission and Fermi energy, as observed in both optical and tunneling spectra.

EXPERIMENTAL

Materials

In(III)Cl$_3$ (99.999+%), tris(trimethylsilyl) arsenide (TMS3As), trioctylphosphine (TOP, 90%; purified by vacuum distillation and kept in the glovebox), AuCl$_3$ (99%), AgCl (99+%), AgNO$_3$ (99+%), CuCl$_2$ (99.999%), dodecylamine (DDA, 98%), didodecyldimethylammonium bromide (DDAB, 98%), toluene (99.8% anhydrous), methanol (99.8% anhydrous) were purchased from Sigma Aldrich except for (TMS$_3$As) which was synthesized as detailed in the literature [17].

Methods

InAs Nanocrystal Synthesis

The synthesis of InAs nanocrystals (NCs) was carried out under an inert atmosphere using standard Schlenck techniques.

In a typical synthesis a mixture of indium and arsenic precursors were prepared by adding 0.3 g (1 mmol) of (TMS$_3$As) to 1.7 g of a 1.4M InCl$_3$ TOP solution (2 mmol in total). 1 ml of this solution was injected into a three neck-flask containing 2 ml of TOP at 300° C. under vigorous stirring. The temperature was then reduced to 260° C. and further precursor solution was added in order to achieve particle growth. The growth was monitored by taking the absorption spectra of aliquots extracted from the reaction solution. Upon reaching the desired size, the reaction mixture was allowed to cool to room temperature and was transferred into a glovebox. Anhydrous toluene was added to the reaction solution, and the nanocrystals were precipitated by adding anhydrous methanol. The size distribution of the nanocrystals in a typical reaction was on the order of 10%. This was improved using size selective precipitation with toluene and methanol as the solvent and anti-solvent, respectively.

Metal-Atom Doping

In a typical reaction a metal solution was prepared by dissolving 10 mg of the metal salt (CuCl$_2$, AgNO$_3$, AgCl or AuCl$_3$), 80 mg DDAB and 120 mg of DDA in 10 ml of toluene. The Cu and Ag solutions prepared in this manner are respectively blue, colorless and yellow. The metal solution was then added drop-wise to a stirred 2 ml toluene solution of InAs NCs. After 15 minutes the absorption and emission of the solutions were measured. The Cu and Au samples were precipitated with methanol whilst the Ag sample was precipitated with acetone. The entire metal treatment procedure was carried out under inert conditions. The ratio of metal atoms to NCs in solution was estimated from the literature values of InAs NC absorption cross-sections.

The invention claimed is:

1. A nanoparticle comprising
a semiconductor material, the semiconductor material being doped with at least two atoms of a dopant material, wherein
the at least two atoms of the dopant material are heterovalent to atoms of the semiconductor material, said at least two atoms of the dopant material being dispersed within the semiconductor material, and
the nanoparticle is free of dopant islands within the nanoparticle and free of dopant islands on the surface of the nanoparticle.

2. A nanoparticle according to claim 1, wherein said at least two atoms of the dopant material alter the density of states of the semiconductor material.

3. The nanoparticle according to claim 1, wherein the nanoparticle consists of the semiconductor material doped with at least two atoms of the dopant material.

4. The nanoparticle according to claim 1, wherein an average length or diameter of the nanoparticle is in the range of 1 nm to 500 nm.

5. The nanoparticle according to claim 1, wherein the semiconductor material is selected from the group of elements consisting of Group I-VII, Group II-VI, Group III-V, Group IV-VI, Group III-VI, and Group IV semiconductors and combinations thereof.

6. The nanoparticle according to claim 5, wherein the semiconductor material is a Group I-VII material being selected from the group consisting of CuCl, CuBr, CuI, AgCl, AgBr, and AgI, or the semiconductor material is a Group II-VI material selected from the group consisting of CdSe, CdS, CdTe, ZnSe, ZnS, ZnTe, HgS, HgSe, HgTe, CdZnSe, ZnO and any combination thereof, or the semiconductor is a Group III-V material being selected from the group consisting of InAs, InP, InN, GaN, InSb, InAsP, InGaAs, GaAs, GaP, GaSb, AlP, AlN, AlAs, AlSb, CdSeTe, ZnCdSe and any combination thereof, or the semiconductor material is a Group IV-VI material being selected from the group consisting of PbSe, PbTe, PbS, PbSnTe, Tl$_2$SnTe$_5$ and any combination thereof, or the semiconductor material comprises an element of Group IV being selected from the group consisting of Si and Ge.

7. The nanoparticle according to claim 5, wherein the semiconductor material is selected from CdSe, CdS, CdTe, ZnSe, ZnS, ZnTe, HgS, HgSe, HgTe, CdZnSe, InAs, InP, InN, GaN, InSb, InAsP, InGaAs, GaAs, GaP, GaSb, AlP, AlN, AlAs, AlSb, CdSeTe, ZnCdSe, PbSe, PbTe, PbS, PbSnTe, Tl$_2$SnTe$_5$, RuS$_2$, RuO$_2$, MoS$_2$, MoO$_3$, RhS$_2$, RuO$_4$, WS$_2$, WO$_2$, Cu$_2$S, Cu$_2$Se, Cu$_2$Te, CuInS$_2$, CuInSe$_2$, CuInTe$_2$ and any combination thereof.

8. The nanoparticle according to claim 7, wherein the semiconductor material is selected from InAs, InP, InN, GaN, InSb, InAsP, InGaAs, GaAs, GaP, GaSb, AlP, AlN, AlAs, AlSb, CdSeTe, ZnCdSe and any combination thereof.

9. The nanoparticle according to claim 8, wherein the semiconductor material is selected from InAs, GaAs, GaP, GaSb, InP, InSb, AlAs, AlP, AlSb and InGaAs.

10. The nanoparticle according to claim 9, wherein the semiconductor material is InAs.

11. The nanoparticle according to claim 1, wherein the dopant material is selected from the group consisting of materials which atoms differ from atoms composing the semiconductor material by one or more valance electron(s).

12. The nanoparticle according to claim 11, wherein the dopant material is selected amongst metals and non-metal materials, said dopant being Li or Mg or Na or K or Rb or Cs or Be or Ca or Sr or Ba or Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or P or As or Sb or Bi or O or S or Se or Te or Po or F or Cl or Br or I or At, or any combination thereof.

13. The nanoparticle according to claim 12, wherein the dopant is selected from Ag and Cu.

14. The nanoparticle according to claim 1, wherein the nanoparticle material is InAs and said dopant is selected from Ag and Cu.

15. The nanoparticle according to claim 1, wherein the number of dopant atoms dispersed in the nanoparticle ranges from $1\times10^{18}$ atoms per $cm^3$ to $1\times10^{23}$ atoms per $cm^3$.

16. The nanoparticle according to claim 1, wherein the number of dopant atoms per nanoparticle is between 2 to 500.

17. The nanoparticle according to claim 1, wherein the nanoparticle is
a n-doped material having negative charge carriers, or
a p-doped material having positive charge carriers.

18. A device comprising a nanoparticle according to claim 1, wherein the nanoparticle is incorporated into a layer and/or a region of the device.

19. The device according to claim 18, wherein the device is a bipolar transistor in a form selected from n-p-n, p-n-p and n-i-p type transistor.

20. The device according to claim 18, wherein the device is selected from a diode; a transistor; an electronic circuit component; an integrated circuit; a detector; a switch; an amplifier; a transducer; a laser; a tag; a biological tag; a photoconductor; a photodiode; a photovoltaic cell; a light emitting diode (LED); a light sensor; a display; and a large area display array.

21. A method for manufacturing a doped semiconductor nanoparticle, said method comprising
providing an undoped nanoparticle comprising a semiconductor material, and
contacting said undoped nanoparticle with at least one doping material under conditions permitting dispersion of at least two atoms of said doping material within said semiconductor material to form a doped semiconductor nanoparticle that is doped with at least two atoms of a dopant material, wherein
said at least two atoms of the dopant material are heterovalent to atoms of said semiconductor material, and
the doped semiconductor nanoparticle is free of dopant islands within the doped semiconductor nanoparticle and free of dopant islands on the surface of the doped semiconductor nanoparticle.

* * * * *